United States Patent
Neuner et al.

(10) Patent No.: US 6,222,665 B1
(45) Date of Patent: Apr. 24, 2001

(54) OPTO-ELECTRIC MODULE

(75) Inventors: Thomas Neuner, München; Dieter Jurzitza, Karlsruhe; Uwe Brand; Reinhold Resch, both of München; Hartmut Burghardt, Holzkirchen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/380,850
(22) PCT Filed: Mar. 13, 1998
(86) PCT No.: PCT/DE98/00758
 § 371 Date: Sep. 9, 1999
 § 102(e) Date: Sep. 9, 1999
(87) PCT Pub. No.: WO98/40776
 PCT Pub. Date: Sep. 17, 1998

(30) Foreign Application Priority Data

Mar. 13, 1997 (DE) .............................. 197 10 504

(51) Int. Cl.$^7$ .............................. G02F 1/03; G02F 1/295; G02B 26/00; G02B 6/36

(52) U.S. Cl. .............................. 359/245; 359/237; 385/8; 385/88

(58) Field of Search .............................. 359/245, 237; 385/8, 88

(56) References Cited

U.S. PATENT DOCUMENTS 4,744,626 * 5/1988 Mery .............................. 385/90

* cited by examiner

*Primary Examiner*—Scott J. Sugarman
*Assistant Examiner*—Michael A. Lucas
(74) *Attorney, Agent, or Firm*—Schiff Hardin & Waite

(57) ABSTRACT

The invention relates to an opto-electric module, comprising a printed circuit board (L) which as an electrical interface has a number of plug-in contacts (SK) running parallel in the area of a first face for directly plugging the module into an assembly. As an optical interface, said printed circuit board is also connected to an optical element (OE) in the area of a second face. The component side and the back of said printed circuit board are also covered at least partly by a housing part (GK, KK).

5 Claims, 1 Drawing Sheet

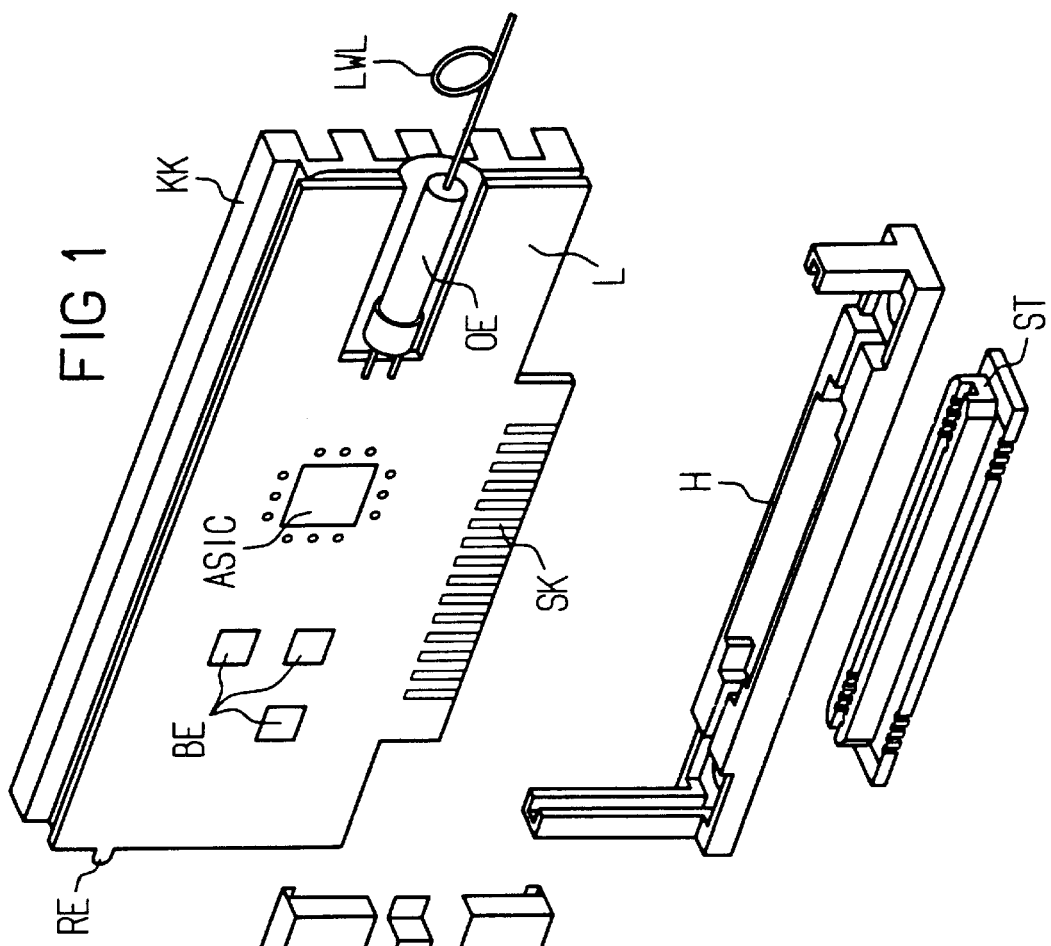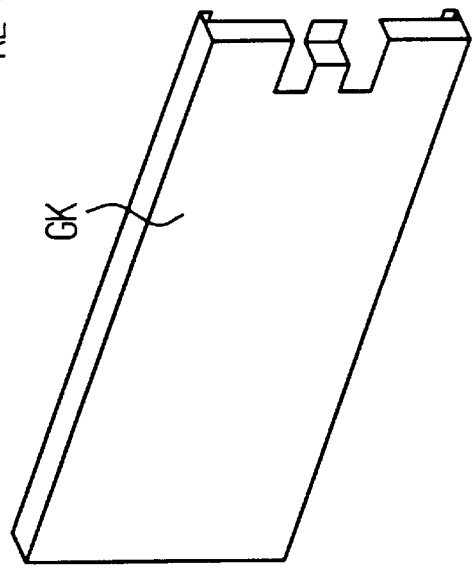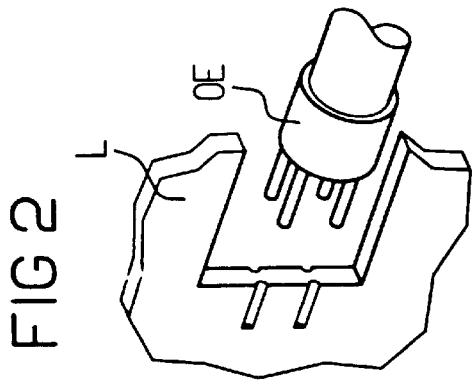

OPTO-ELECTRIC MODULE

BACKGROUND OF THE INVENTION

The invention is directed to an opto-electrical module for converting optical signals into electrical signals or, respectively, electrical signals into optical signals.

Such modules are frequently employed in broadband communication systems such as, for example, in communication systems operating according to an asynchronous transfer mode (ATM) since signal conversions of optical signals into electrical signals and vice versa are in part provided within such a system. For example, due to the requirement of a high data throughput rate, a transmission of message signals, in the form of message cells in an ATM system, thus frequently only ensues in electrical form within existing switching networks. After passing through such a switching network, for example, a plurality of message signals streams to be forwarded in the same direction is then multiplexed and converted by an electrical/optical transducer into an optical multiplex signal that is subsequently forwarded to a following system means, for example to a following switching network. In the opposite direction, an optical multiplex signal formed of a plurality of message signal streams and supplied to a switching network is resolved into the individual message signal streams by an optical/electrical transducer and converted into electrical message signal streams. These message signal streams are then forwarded via the corresponding switching network.

SUMMARY OF THE INVENTION

An object of the present invention is then to disclose a way of how an opto-electrical module of the species initially cited can be fashioned in order, on the one hand, to realize this cost-beneficially and, on the other hand, to also design this for the transmission of high bit rates.

In a module of the species initially cited, this object is achieved in that, the module comprises a printed circuit board has a circuit carrier equipped with electrical components that, as an electrical interface on the one hand, comprises a plurality of metallic plugin contacts proceeding parallel in the region of a first end face for direct plugging of the module into a connector element of an electrical assembly that is complementary to these plugin contacts, the printed circuit board, as an optical interface on the other hand, is connected to an optical element in the region of a second end face, and in that components side and back side of the printed circuit board are respectively at least partially covered by a preferably metallic housing part.

The invention thereby yields the advantage that the opto-electrical module can be realized cost-beneficially and in space-saving fashion with simple structural means. Over and above this, the pluggability of the module enables a variable equipping and a simple replacement. Finally, an extremely good, electrical highfrequency junction can be achieved due to the direct contact plugging.

Advantageous developments of the opto-electrical module derive from providing the back side housing part as a cooling member which is glued to the back side, and the housing part for the components' side is a detachably connected cap. In addition, the plug connections are attached to both sides of the circuit board and the optical element is received in a recess in the board. Their advantages shall be discussed in conjunction with the explanation of an exemplary embodiment of the invention.

BRIEF DESCRIPTION OF THE DRAWINGS

FIG. 1 is a schematic, exploded perspective view of an opto-electrical module according to the present invention; and FIG. 2 shows portions of a printed circuit board shown in FIG. 1 and an optical element to be accepted therein.

DESCRIPTION OF THE PREFERRED EMBODIMENT

The opto-electrical module shown in FIG. 1 comprises a printed circuit board L serving as a circuit carrier on which all components BE, ASIC serving in the present exemplary embodiment for a signal conversion of optical signals into electrical signals and vice versa are present. The basis is thereby formed by a customized module ASIC. For saving space and for better heat elimination, this customized module is thereby inserted into the printed circuit board in "naked chip" technology, which is also referred to as "chip-on-board" technology. The module together with the bond wires is thereby protected by an epoxy covering in drop form ("GLOBETOP").

A plurality of metallic plugin contacts SK that proceed parallel are thereby provided in the region of the lower end face of the printed circuit board L, namely in the middle region thereof, and as an electrical interface of the opto-electrical module, these contacts are gold-plated in the present exemplary embodiment for good conductivity. These plugin contacts that, for example, are arranged at both sides of the printed circuit board serve for a direct plugging of the opto-electrical module into a connector element ST of an electrical assembly (not shown) that is complementary to these plugin contacts. For an acceptance of the plugin contacts into the connector element ST fashioned as jack strip, that part of the printed circuit board comprising these plugin contacts is salient at the end face. The part of the printed circuit board lying at both sides of the plugin contacts, by contrast, is set back relative to the plugin contacts.

Moreover, the jack strip ST is introduced into a holder reference H in FIG. 1 that is in turn fixed on the aforementioned assembly, for example with screwed connections. This holder comprises a respective guide rail at each of its end faces. As a result of the two guide rails, the opto-electrical module is guided both when being plugged into the jack strip as well as when in its plugged condition. In order to avoid an unintentional loosening of the module, a latch element RE is provided at least in the region of one of the end faces of the printed circuit board proceeding perpendicular to the plugin contacts SK, and the latch element RE is accepted into a complementary latch element of the guide rail coming into consideration in the holder H for a positional fixing. The latch element RE, for example, is thereby fashioned as a catch nose at said end face of the printed circuit board (at the left side in FIG. 1) that can be accepted by a depression in said guide rail.

The optical interface of the opto-electrical module is formed by an optical element OE with a light waveguide LWL connected thereto. This optical element, which is formed of a laser diode (transmitter) or of what is referred to as a PIN diode (receiver) dependent on the transmission direction of the module, is accepted into a recess of the printed circuit board L that proceeds axially relative to the optical element and corresponds to the dimensions of the optical element. According to FIG. 1, this recess proceeds inward from the middle of the right-hand end face of the printed circuit board L, namely perpendicular to the plugin contacts SK.

FIG. 2 shows the arrangement of the optical element OE in the aforementioned recess of the printed circuit board L in greater detail. As indicated in this Figure, the optical element has a plurality of terminals, for example four terminals given a laser diode with monitor diode and three terminals given a PIN diode. This optical element is guided to the end face of the printed circuit board L in said recess up to an air gap of 1 mm and has its terminals soldered to both sides of the printed circuit board thereat, namely two terminals per printed circuit board side given a laser diode and with two terminals on the one printed circuit board side and the remaining, one terminal at the other printed circuit board side given a PIN diode. The air gap between the optical element and the printed circuit board serves, moreover, for the thermal relief of this optical element.

As indicated in FIG. 1, a preferably metallic housing part is provided at the back side of the printed circuit board L, so that the printed circuit board is covered above the plugin contacts SK by said housing part. In the present exemplary embodiment, this housing part is fashioned as a cooling member KK for heat elimination. This cooling member comprises a planar inside surface for gluing onto the back side of the printed circuit board L and comprises an outside provided with cooling ribs. Over and above this, the printed circuit board is fashioned multi-layer with thick inside copper layers in order to achieve a beneficial heat distribution within the printed circuit board.

Under the recess of the printed circuit board L provided for the optical element OE, a depression fashioned as a hemi-cylinder and corresponding to the dimensions of this recess is provided at the inside surface of the cooling member, so that about half the optical is being accepted therein.

At its edge lying above the plugin contacts SK, the cooling member is provided with a fold toward the printed circuit board L that proceeds over the entire edge. A corresponding fold is also attached to the opposite edge of the cooling member. As a result of these two folds, a respective channel is formed at the top and bottom between printed circuit board L and cooling member KK. These channels serve as latch elements (yet to be explained) for a preferably metallic housing part GK attachable to the components side of the printed circuit board that is preferably fashioned as a housing cap in order to mechanically protect the components present on the printed circuit board and avoid high-frequency noise influences. In the exemplary embodiment, this housing cap comprises a downwardly directed extension angled perpendicularly off over the entire length at its edge directed toward the printed circuit board and proceeding parallel to the aforementioned, upper channel. The housing cap GK can be accepted into this channel with this extension.

The housing cap GK lies against the printed circuit board in the region above the plugin contacts SK. At least respectively one clip that projects beyond the printed circuit board in the direction of the cooling member, by contrast, is provided in the direction of the printed circuit board in the two regions next to the plugin contacts. An inwardly directed catch nose that engages into the aforementioned, lower channel between printed circuit board L and cooling member KK is present in each of these clips. This channel thus represents a complementary latch element for these catch noses.

In the region of the optical element OE, over and above this, the housing cap GK comprises a cutout proceeding from the end face thereof to the upper side in which a multiply angled, resilient clip fashioned in the interior of the housing cap is present. When the housing cap is engaged, this clip presses against the optical element OE as a compression spring.

Due to the soldering of the optical element OE and the resilient fixing thereof by the housing cap GK, no additional fastening flanges for fastening are required at this optical element. What is also achieved together with the other structural means explained above is that an opto-electrical element OE comprises no screwed connections whatsoever, and, thus, final assembly is cost-beneficial. Due to the space-saving structure of an opto-electrical module, moreover, a plurality of such modules can be accommodated on an aforementioned assembly.

Further advantages with respect to manipulation, service, repair and manufacturing costs of the assemblies derive as a result of the above-explained plugin principle of modules on assemblies. On the one hand, thus, a plugin module with electrical testing lines that is plugged into a jack strip of an assembly provided for an opto-electrical module can be used in order to be able to implement an electrical testing of the appertaining assembly without employing an opto-electrical module. This is advantageous particularly in the testing phase of an assembly.

The employment of the plugin principle of modules on an assembly also allows the actual equipping of the assembly with modules to be adapted to the degree of utilization of the assembly. This means that opto-electrical modules not required at the moment are replaced by cost-beneficial termination modules that correspond in shape and size to the opto-electrical modules and terminate the module connection in terms of impedance. As needed, termination modules can then be replaced by optoelectrical modules, which are costlier compared thereto.

In conclusion, let it also be pointed out that the above-explained structural means for constructing an opto-electrical module can also be modified. This is especially true of the aforementioned latch elements and the latch elements complementary thereto.

What is claimed is:

1. Opto-electrical module for converting optical signals into electrical signals or, respectively, electrical signals into optical signals, the module comprising a printed circuit board as a circuit carrier equipped with electrical components on one surface that, as an electrical interface on the one hand, comprises a plurality of metallic plugin contacts proceeding parallel in the region of a first end face for direct plugging of the module into a connector element of an electrical assembly that is complementary to these plugin contacts;

the printed circuit board, as an optical interface on the other hand, being connected to an optical element in the region of a second end face, and the optical element being accepted into a recess of the printed circuit board proceeding perpendicularly inward from the second end face and having electrical terminals of the element being soldered therein to solder contacts of the printed circuit board; and the one surface and a back side of the printed circuit board being at least partially covered by a preferably metallic housing part.

2. Opto-electrical module according to claim 1, wherein the housing part provided at the back side of the printed circuit board is fashioned as cooling member.

3. An opto-electrical module according to claim 2, wherein the cooling member has a planar surface, which is directed toward the printed circuit board, secured to the back side of the printed circuit board.

4. An opto-electrical module according to claim 1, wherein the housing part provided at the one surface of the printed circuit board is fashioned as a housing cap that is detachably connected via latch elements to the housing part provided at the back side of the printed circuit board.

5. An opto-electrical module according to claim 1, wherein the plugin contacts are attached both to the one surface as well as to the back side of the printed circuit board.

* * * * *